(12) United States Patent
Mishra et al.

(10) Patent No.: US 9,644,068 B2
(45) Date of Patent: May 9, 2017

(54) SEMICONDUCTING MATERIALS BASED ON NAPHTHALENEDIIMIDE-VINYLENE-OLIGOTHIOPHENE-VINYLENE POLYMERS

(71) Applicants: BASF SE, Ludwigshafen (DE); Polyera Corporation, Skokie, IL (US)

(72) Inventors: Ashok Kumar Mishra, Singapore (SG); Yucui Guan, Hangzhou (CN); Hiroyoshi Noguchi, Nishinomiya (JP); Mi Zhou, Singapore (SG); Chongjun Jiao, Singapore (SG); Florian Dötz, Mannheim (DE)

(73) Assignees: BASF SE, Ludwigshafen (DE); FLEXTERRA, INC., Skokie, IL (US)

( * ) Notice: Subject to any disclaimer, the term of this patent is extended or adjusted under 35 U.S.C. 154(b) by 0 days.

(21) Appl. No.: 14/653,055

(22) PCT Filed: Dec. 12, 2013

(86) PCT No.: PCT/IB2013/060880
§ 371 (c)(1),
(2) Date: Jun. 17, 2015

(87) PCT Pub. No.: WO2014/097079
PCT Pub. Date: Jun. 26, 2014

(65) Prior Publication Data
US 2015/0333264 A1 Nov. 19, 2015

(30) Foreign Application Priority Data
Dec. 18, 2012 (EP) .................... 12197747

(51) Int. Cl.
*C08G 61/12* (2006.01)
*H01L 51/00* (2006.01)
(Continued)

(52) U.S. Cl.
CPC .......... *C08G 61/126* (2013.01); *C09B 69/109* (2013.01); *H01L 51/0036* (2013.01);
(Continued)

(58) Field of Classification Search
CPC . C08G 61/126; C09B 69/109; H01L 51/0036; H01L 51/0048
See application file for complete search history.

(56) References Cited
U.S. PATENT DOCUMENTS
3,844,916 A 10/1974 Gaske
4,218,218 A 8/1980 Daubach et al.
(Continued)

FOREIGN PATENT DOCUMENTS
CA 2159265 A1 3/1996
CN 101965374 A 2/2011
(Continued)

OTHER PUBLICATIONS
Yan et al., "A high-mobility electron-transporting polymer for printed transistors", Nature, vol. 457, pp. 679-687 (2009).
Durban et al., "Synthesis and Characterization of Solution-Processable Ladderized n-Type Naphthalene Bisimide Copolymers for OFET Applications", Macromolecules, vol. 44, pp. 4721-4728 (2011).
(Continued)

*Primary Examiner* — Liam J Heincer
*Assistant Examiner* — Nicholas Hill
(74) *Attorney, Agent, or Firm* — Drinker Biddle & Reath LLP

(57) ABSTRACT
The present invention provides a polymer comprising a unit of formula,

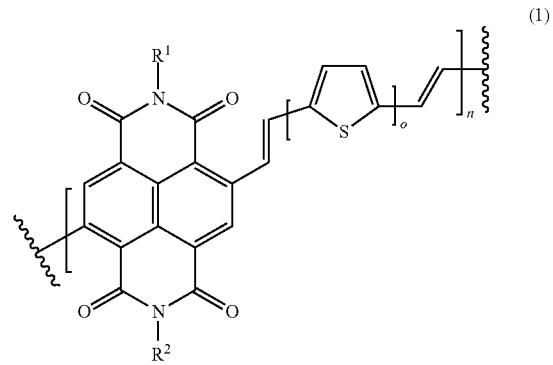

wherein
$R^1$ and $R^2$ are independently from each other $C_{1-30}$-alkyl, $C_{2-30}$-alkenyl, $C_{2-30}$-alkynyl, phenyl or a 5 to 8 membered heterocyclic ring system, wherein
each of the $C_{1-30}$-alkyl, $C_{2-30}$-alkenyl or $C_{2-30}$-alkynyl group may be substituted with 1 to 10 substituents independently selected from the group consisting of halogen, —CN, —NO$_2$, —OH, —NH$_2$, —NH($C_{1-20}$-alkyl), —N($C_{1-20}$-alkyl)$_2$, —NH—C(O)—($C_{1-20}$-alkyl), —S(O)$_2$OH, —CHO, —C(O)—$C_{1-20}$-alkyl, —C(O)OH, —C(O)—O$C_{1-20}$-alkyl, —C(O)NH$_2$, —CO(O)NH—$C_{1-20}$-alkyl, —C(O)N($C_{1-20}$-alkyl)$_2$, —O—$C_{1-20}$-alkyl, —O—C(O)—$C_{1-20}$-alkyl, —SiH$_3$, SiH$_2$($C_{1-20}$-alkyl), SiH($C_{1-20}$-alkyl)$_2$, Si($C_{1-20}$-alkyl)$_3$, $C_{4-8}$-cycloalkyl, phenyl and a 5 to 8 membered heterocyclic ring system, and phenyl and the 5 to 8 membered heterocyclic ring system may be substituted with 1 to 5 $C_{1-16}$-alkyl groups,
$o$ is 1, 2 or 3
and
$n$ is an integer from 2 to 10'000,
a process for the preparation of the polymer and an electronic device comprising the polymer.

20 Claims, No Drawings

(51) Int. Cl.
*C09B 69/10* (2006.01)
*H01L 51/42* (2006.01)
*H01L 51/05* (2006.01)

(52) U.S. Cl.
CPC ...... *H01L 51/0043* (2013.01); *C08G 2261/12* (2013.01); *C08G 2261/1412* (2013.01); *C08G 2261/3223* (2013.01); *C08G 2261/3241* (2013.01); *C08G 2261/344* (2013.01); *C08G 2261/411* (2013.01); *C08G 2261/413* (2013.01); *C08G 2261/51* (2013.01); *C08G 2261/91* (2013.01); *C08G 2261/92* (2013.01); *H01L 51/0558* (2013.01); *H01L 51/4253* (2013.01); *Y02E 10/549* (2013.01)

(56) References Cited

U.S. PATENT DOCUMENTS

| | | | |
|---|---|---|---|
| 4,287,039 | A | 9/1981 | Buethe et al. |
| 4,339,566 | A | 7/1982 | Rosenkranz et al. |
| 4,384,056 | A | 5/1983 | Schmidt et al. |
| 4,575,330 | A | 3/1986 | Hull |
| 4,710,523 | A | 12/1987 | Lechtken et al. |
| 4,719,297 | A | 1/1988 | Henne et al. |
| 4,737,593 | A | 4/1988 | Ellrich et al. |
| 4,753,817 | A | 6/1988 | Meixner et al. |
| 5,013,768 | A | 5/1991 | Kiriyama et al. |
| 5,096,935 | A | 3/1992 | Kleiner et al. |
| 5,186,846 | A | 2/1993 | Brueckmann et al. |
| 5,210,110 | A | 5/1993 | Rutsch et al. |
| 5,407,969 | A | 4/1995 | Kleiner et al. |
| 5,482,649 | A | 1/1996 | Meixner et al. |
| 5,538,548 | A | 7/1996 | Yamazaki |
| 5,587,404 | A | 12/1996 | Kröner et al. |
| 5,620,751 | A | 4/1997 | Brindoepke et al. |
| 5,734,002 | A | 3/1998 | Reich et al. |
| 5,922,473 | A | 7/1999 | Muthiah et al. |
| 6,306,555 | B1 | 10/2001 | Schulz et al. |
| 7,097,456 | B1 | 8/2006 | Dede et al. |
| 7,503,801 | B2 | 3/2009 | Mahieux et al. |
| 7,511,084 | B2 | 3/2009 | Noe et al. |
| 7,714,034 | B2 | 5/2010 | Moszner et al. |
| 7,976,148 | B2 | 7/2011 | Kishi et al. |
| 8,470,961 | B2 * | 6/2013 | Facchetti ............... C08G 61/10 528/367 |
| 8,796,672 | B2 * | 8/2014 | Facchetti ............... C08G 61/10 257/40 |
| 9,219,233 | B2 * | 12/2015 | Facchetti ............... C08G 61/10 |
| 2002/0107413 | A1 | 8/2002 | Wolf et al. |
| 2012/0115963 | A1 | 5/2012 | Gruetzmacher et al. |
| 2013/0200336 | A1 * | 8/2013 | Vaidyanathan ...... C08G 61/126 257/40 |

FOREIGN PATENT DOCUMENTS

| | | |
|---|---|---|
| DE | 2936039 A1 | 4/1981 |
| DE | 4228514 A1 | 3/1994 |
| DE | 19700064 A1 | 7/1997 |
| DE | 19727767 A1 | 1/1999 |
| EP | 012339 A1 | 6/1980 |
| EP | 033896 A1 | 8/1981 |
| EP | 041125 A1 | 12/1981 |
| EP | 245639 A2 | 11/1987 |
| EP | 280222 A2 | 8/1988 |
| EP | 339841 A2 | 11/1989 |
| EP | 438123 A2 | 7/1991 |
| EP | 636669 A2 | 2/1995 |
| EP | 678534 A1 | 10/1995 |
| EP | 704469 A2 | 4/1996 |
| GB | 2180358 A | 3/1987 |
| WO | WO-99/03930 A1 | 1/1999 |
| WO | WO-00/10974 A2 | 3/2000 |
| WO | WO-00/20517 A2 | 4/2000 |
| WO | WO-01/42313 A1 | 6/2001 |
| WO | WO-03068785 A1 | 8/2003 |
| WO | WO-2004/074328 A1 | 9/2004 |
| WO | WO-2006/008251 A2 | 1/2006 |
| WO | WO-2006/056542 A1 | 6/2006 |
| WO | WO-2006056541 A1 | 6/2006 |
| WO | WO-2009/098253 A1 | 8/2009 |
| WO | WO-2010/052287 A1 | 5/2010 |
| WO | WO-2010133381 A1 | 11/2010 |
| WO | WO-2011/144537 A1 | 11/2011 |
| WO | WO-2012012067 A1 | 1/2012 |
| WO | WO-2013020469 A1 | 2/2013 |

OTHER PUBLICATIONS

Guo et al., "Naphthalene Diimide-Based Polymer Semiconductors: Synthesis, Structure-Property Correlations, and n-Channel and Ambipolar Field-Effect Transistors", Chemistry of Materials, vol. 24, pp. 1434-1442 (2012).
Sajoto et al., "Synthesis and characterization of naphthalene diimide/diethynylbenzene copolymers", Polymer, vol. 53, pp. 1072-1078 (2012).
Zhou et al., "Conjugated Polymers of Rylene Diimide and Phenothiazine for n-Channel Organic Field-Effect Transistors", Macromolecules, vol. 45, pp. 4115-4121 (2012).
International Search Report for PCT/IB2013/060880 mailed May 8, 2014.
Mikroyannidis J.A. et al., "Alternating phenylenevinylene and thienylenevinylene copolymers with cyano groups: Synthesis, photophysics and photovoltaics", Synthetic Metals, Jan. 1, 2009, vol. 159, No. 1-2, pp. 142-147.
Supplementary European Search Report for EP 13 86 5726, mailed Apr. 29, 2016.
International Search Report for PCT/EP2013/076707 mailed Jan. 27, 2014.

* cited by examiner

SEMICONDUCTING MATERIALS BASED ON NAPHTHALENEDIIMIDE-VINYLENE-OLIGOTHIOPHENE-VINYLENE POLYMERS

CROSS-REFERENCE TO RELATED APPLICATIONS

This application is a national stage application (under 35 U.S.C. §371) of PCT/IB2013/060880, filed Dec. 12, 2013, which claims benefit of European Application No. 12197747.4, filed Dec. 18, 2012, both of which are incorporated herein by reference in their entirety.

Organic semiconducting materials can be used in electronic devices such as organic photovoltaic devices (OPVs), organic field-effect transistors (OFETs), organic light emitting diodes (OLEDs), and organic electrochromic devices (ECDs).

For efficient and long lasting performance, it is desirable that the organic semiconducting material-based devices show high charge carrier mobility as well as high stability, in particular towards oxidation by air.

Furthermore, it is desirable that the organic semiconducting materials are compatible with liquid processing techniques such as spin coating, inkjet printing and gravure printing. These liquid processing techniques are convenient from the point of processability, and thus allow the production of low cost organic semiconducting material-based electronic devices. In addition, liquid processing techniques are also compatible with plastic substrates, and thus allow the production of light weight and mechanically flexible organic semiconducting material-based electronic devices.

The organic semiconducting materials can be either p-type or n-type organic semiconducting materials. It is desirable that both types of organic semiconducting materials are available for the production of electronic devices.

The use of naphthalene diimide (NDI) based polymers as semiconducting materials in electronic devices is known in the art.

Durban, M. M.; Kazarinoff, P. D.; Segawa, Y.; Luscombe. C. K. *Macromolecules* 2011, 44, 4721 to 4727 describe highly soluble naphthalenediimide (NDI) polymers. Average electron mobilities as high as 0.0026 cm$^2$ V$^{-1}$ s$^{-1}$ are reported for the naphthalene diimide (NDI) polymer PNDI-2BocL having the following structure:

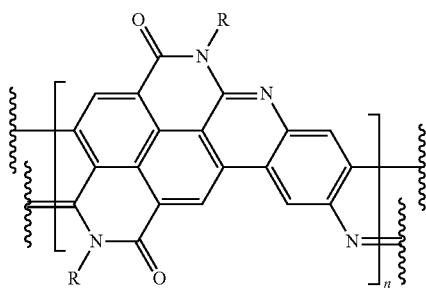

Sajoto, T.; Tiwari, S. P.; Li, H.; Risko, C.; Barlowa, S.; Zhang, Q.; Cho, J.-Y.; Brédas, J.-L.; Kippelen, B.; Marder, S. R. *Polymer,* 2012, 53, 5, 1072 to 1078 describe copolymers having the following structure:

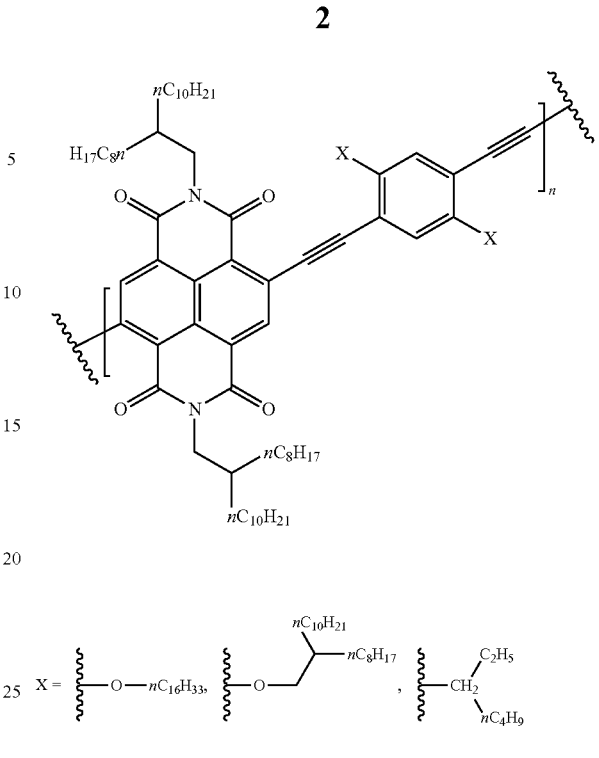

These copolymers show average electron mobility values ranging from $1.4 \times 10^{-4}$ to $3.7 \times 10^{-3}$ cm$^2$ V$^{-1}$ s$^{-1}$.

Zhou, W.; Wen, Y.; Ma, L.; Liu, Y.; Zhan, X. *Macromolecules* 2012, 45, 4115 to 4121 describe naphthalene diimide (NDI) and phenothiazine (PTZ) based copolymers having the following structure:

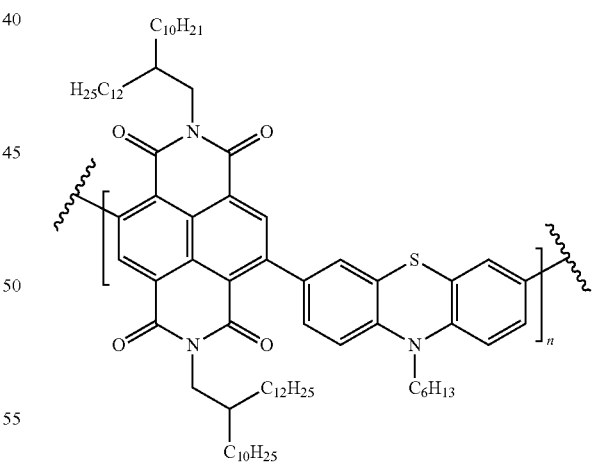

These copolymers exhibit electron mobilities as high as 0.05 cm$^2$ V$^{-1}$ s$^{-1}$ and on/off ratios as high as $10^5$ under nitrogen atmosphere.

Yan, H.; Chen, Z.; Zheng, Y., Newman, C.; Quinn, J. R.; Dötz, F. Kastler, M.; Facchetti, A. *Nature,* 2009, 457, 679 to 687 and Chen, Z.; Zheng, Y.; Yan, H.; Facchetti, A. *J. Am. Chem. Soc.* 2009, 131, 8 to 9 describe naphthalene diimide (NDI) and bithiophene based copolymer having the following structure:

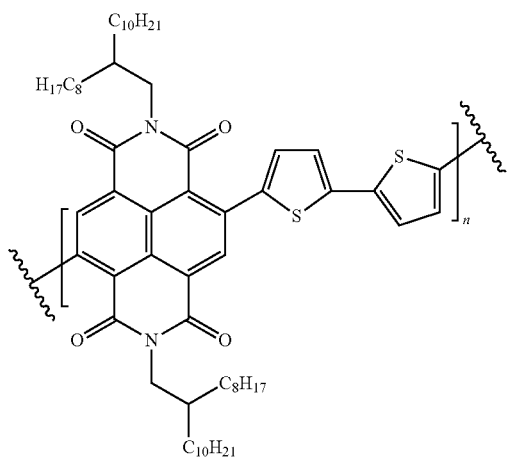

These copolymers show excellent mobility values of up to 0.45 to 0.85 cm$^2$ V$^{-1}$ s$^{-1}$.

WO 2009/098253 describes polymers of general formula -(-M$_1$-M$_2$)$_n$-, wherein M$_1$ is an optionally substituted naphthalene imide selected from

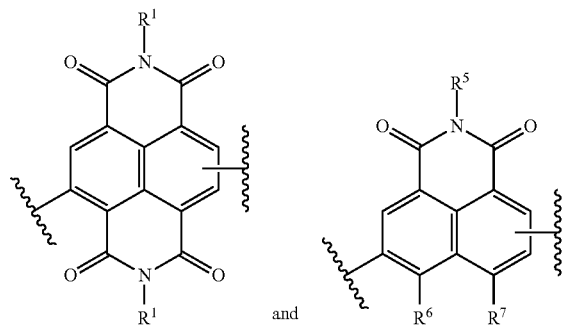

and M$_2$ is selected from a list of residues including Z—(—Ar—)$_{m''}$—Z—.

Guo, X.; Kim, F. S.; Seger, M. J.; Jenekhe, S. A.; Watson, M. D. *Chem. Mater.* 2012, 24, 1434 to 1442 describe a series of alternating donor-acceptor copolymer semiconductors based on naphthalene diimide (NDI) acceptor and seven different thiophene moieties having the following structures:

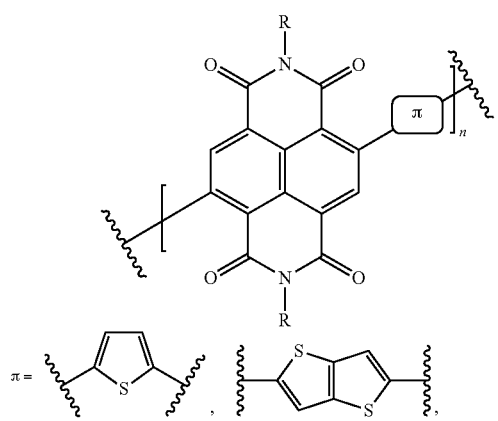

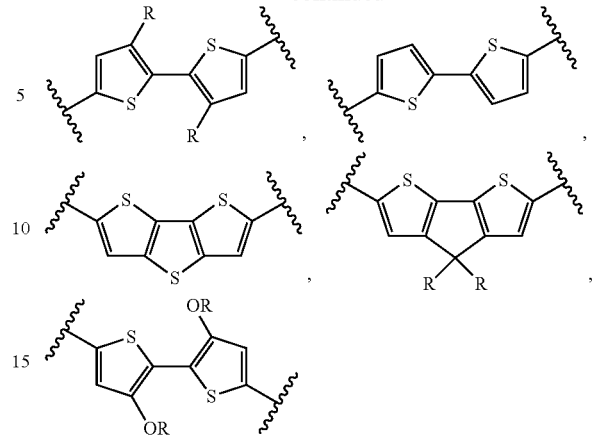

R=2-decyltetradecyl, 2-ethylhexyl, n-dodecyl, n-octyl.

These copolymers display n-channel or ambipolar mobility as high as 0.07 cm$^2$V$^{-1}$s$^{-1}$.

It was the object of the present invention to provide improved new organic polymeric semiconducting materials.

The object is solved by the polymers, processes and devices described herein.

The organic polymeric semiconducting material of the present invention is a polymer comprising a unit of formula, (1)

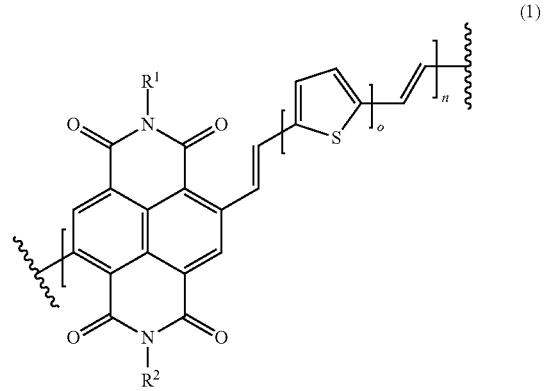

wherein

R$^1$ and R$^2$ are independently from each other C$_{1-30}$-alkyl, C$_{2-30}$-alkenyl, C$_{2-30}$-alkynyl, phenyl or a 5 to 8 membered heterocyclic ring system, wherein each of the C$_{1-30}$-alkyl, C$_{2-30}$-alkenyl or C$_{2-30}$-alkynyl group may be substituted with 1 to 10 substituents independently selected from the group consisting of halogen, —CN, —NO$_2$, —OH, —NH$_2$, —NH(C$_{1-20}$-alkyl), —N(C$_{1-20}$-alkyl)$_2$, —NH—C(O)—(C$_{1-20}$-alkyl), —S(O)$_2$OH, —CHO, —C(O)—C$_{1-20}$-alkyl, —C(O)OH, —C(O)—OC$_{1-20}$-alkyl, —C(O)NH$_2$, —CO(O)NH—C$_{1-20}$-alkyl, —C(O)N(C$_{1-20}$-alkyl)$_2$, —O—C$_{1-20}$-alkyl, —O—C(O)—C$_{1-20}$-alkyl, —SiH$_3$, SiH$_2$(C$_{1-20}$-alkyl), SiH(C$_{1-20}$-alkyl)$_2$, Si(C$_{1-20}$-alkyl)$_3$, C$_{4-8}$-cycloalkyl, phenyl and a 5 to 8 membered heterocyclic ring system, and phenyl and the 5 to 8 membered heterocyclic ring system may be substituted with 1 to 5 C$_{1-16}$-alkyl groups, o is 1, 2 or 3
and
n is an integer from 2 to 10'000.

Examples of halogen are —F, —Cl, —Br and —I.

$C_{1-6}$-alkyl, $C_{1-10}$-alkyl, $C_{1-16}$-alkyl, $C_{1-30}$-alkyl, $C_{6-30}$-alkyl and $C_{10-30}$-alkyl can be branched or unbranched. Examples of $C_{1-6}$-alkyl are methyl, ethyl, n-propyl, isopropyl, n-butyl, sec-butyl, isobutyl, tert-butyl, n-pentyl, neopentyl, isopentyl, n-(1-ethyl)propyl and n-hexyl. Examples of $C_{1-10}$-alkyl are $C_{1-6}$-alkyl, n-heptyl, n-octyl, n-(2-ethyl)hexyl, n-nonyl and n-decyl. Examples of $C_{1-16}$-alkyl are $C_{1-10}$-alkyl, n-undecyl, n-dodecyl, n-undecyl, n-dodecyl, n-tridecyl, n-tetradecyl, n-pentadecyl and n-hexadecyl. Examples of $C_{1-20}$-alkyl are $C_{1-10}$-alkyl, n-undecyl, n-dodecyl, n-undecyl, n-dodecyl, n-tridecyl, n-tetradecyl, n-pentadecyl, n-hexadecyl, n-heptadecyl, n-octadecyl, n-nonadecyl, n-icosyl ($C_{20}$) and n-(2-octyl)dodecyl. Examples of $C_{1-30}$-alkyl are $C_{1-20}$-alkyl, and n-docosyl ($C_{22}$), n-tetracosyl ($C_{24}$), n-(2-decyl)tetradecyl, n-hexacosyl ($C_{26}$), n-octacosyl ($C_{28}$) and n-triacontyl ($C_{30}$). Examples of $C_{6-30}$-alkyl are n-hexyl, n-heptyl, n-octyl, n-(2-ethyl)hexyl, n-nonyl, n-decyl, n-undecyl, n-dodecyl, n-undecyl, n-dodecyl, n-tridecyl, n-tetradecyl, n-pentadecyl, n-hexadecyl, n-heptadecyl, n-octadecyl, n-nonadecyl and n-icosyl ($C_{20}$), n-(2-octyl)dodecyl, n-docosyl ($C_{22}$), n-tetracosyl ($C_{24}$), n-(2-decyl)tetradecyl, n-hexacosyl ($C_{26}$), n-octacosyl ($C_{28}$) and n-triacontyl ($C_{30}$). Examples of $C_{10-30}$-alkyl are n-decyl, n-undecyl, n-dodecyl, n-undecyl, n-tridecyl, n-tetradecyl, n-pentadecyl, n-hexadecyl, n-heptadecyl, n-octadecyl, n-nonadecyl and n-icosyl ($C_{20}$), n-(2-octyl)dodecyl, n-docosyl ($C_{22}$), n-tetracosyl ($C_{24}$), n-(2-decyl)tetradecyl, n-hexacosyl ($C_{26}$), n-octacosyl ($C_{28}$) and n-triacontyl ($C_{30}$).

$C_{2-30}$-alkenyl and $C_{6-30}$-alkenyl can be branched or unbranched. Examples of $C_{2-30}$-alkenyl are vinyl, propenyl, cis-2-butenyl, trans-2-butenyl, 3-butenyl, cis-2-pentenyl, trans-2-pentenyl, cis-3-pentenyl, trans-3-pentenyl, 4-pentenyl, 2-methyl-3-butenyl, hexenyl, heptenyl, octenyl, nonenyl and docenyl, linoleyl ($C_{18}$), linolenyl ($C_{18}$), oleyl ($C_{18}$), arachidonyl ($C_{20}$), and erucyl ($C_{22}$). Examples of $C_{6-30}$-alkenyl are hexenyl, heptenyl, octenyl, nonenyl and docenyl, linoleyl ($C_{18}$), linolenyl ($C_{18}$), oleyl ($C_{18}$), arachidonyl ($C_{20}$), and erucyl ($C_{22}$).

$C_{2-30}$-alkynyl and $C_{6-30}$-alkynyl can be branched or unbranched. Examples of $C_{2-30}$-alkynyl are ethynyl, 2-propynyl, 2-butynyl, 3-butynyl, pentynyl, hexynyl, heptynyl, octynyl, nonynyl, decynyl, undecynyl, dodecynyl, undecynyl, dodecynyl, tridecynyl, tetradecynyl, pentadecynyl, hexadecynyl, heptadecynyl, octadecynyl, nonadecynyl and icosynyl ($C_{20}$). Examples of $C_{6-30}$-alkynyl are hexynyl, heptynyl, octynyl, nonynyl, decynyl, undecynyl, dodecynyl, undecynyl, dodecynyl, tridecynyl, tetradecynyl, pentadecynyl, hexadecynyl, heptadecynyl, octadecynyl, nonadecynyl and icosynyl ($C_{20}$).

Examples of $C_{4-8}$-cycloalkyl are cyclobutyl, cyclopentyl, cycloexyl, cycloheptyl and cyclooctyl.

Examples of 5 to 8 membered heterocyclic systems are pyrrolidinyl, 1-pyrrolinyl, 2-pyrrolinyl, 3-pyrrolinyl, tetrahydrofuryl, 2,3-dihydrofuryl, tetrahydrothiophenyl, 2,3-dihydrothiophenyl, imidazolidinyl, imidazolinyl, pyrazolidinyl, pyrazolinyl, oxazolidinyl, oxazolinyl, isoxazolidinyl, isoxazolinyl, thiazolidinyl, thiazolinyl, isothiazolidinyl and isothiazolinyl, 1,2,3-triazolyl, 1,2,4-triazolyl, 1,4,2-dithiazolyl, piperidyl, piperidino, tetrahydropyranyl, pyranyl, thianyl, thiopyranyl, piperazinyl, morpholinyl, morpholino, thiazinyl, azepanyl, azepinyl, oxepanyl, thiepanyl, thiapanyl, thiepinyl, 1,2-diazepinyl, 1,3-thiazepinyl, pyrrolyl, furyl, thiophenyl, imidazolyl, pyrazolyl, oxazolyl, isoxazolyl, thiazolyl, isothiazolyl, 1,2,3-triazolyl, 1,2,4-triazolyl, oxadiazolyl, tetrazolyl, pyridyl, pyrazinyl, pyrimidinyl, pyridazinyl, 1,2,3-triazinyl, 1,2,4-triazinyl, 1,3,5-triazinyl, azepinyl and 1,2-diazepinyl.

Examples of alkali metals are sodium, potassium and lithium.

Examples of alkaline earth metals are calcium and magnesium.

Preferably, the organic polymeric semiconducting material of the present invention is a polymer comprising preferably at least 80% by weight, more preferably at least 90% by weight, of a unit of formula (1), based on the weight of the polymer.

More preferably, the organic polymeric semiconducting material of the present invention is a polymer consisting essentially of a unit of formula (1).

Preferably, $R^1$ and $R^2$ are independently from each other $C_{6-30}$-alkyl, $C_{6-30}$-alkenyl, $C_{6-30}$-alkynyl, or phenyl,
wherein each of the $C_{6-30}$-alkyl, $C_{6-30}$-alkenyl or $C_{6-30}$-alkynyl group may be substituted with 1 to 10 substituents independently selected from the group consisting of halogen, —CN, —NO$_2$, —OH, —NH$_2$, —NH($C_{1-20}$-alkyl), —N($C_{1-20}$-alkyl)$_2$, —NH—C(O)—($C_{1-20}$-alkyl), —S(O)$_2$OH, —CHO, —C(O)—$C_{1-20}$-alkyl, —C(O)OH, —C(O)—O$C_{1-20}$-alkyl, —C(O)NH$_2$, —CO(O)NH—$C_{1-20}$-alkyl, —C(O)N($C_{1-20}$-alkyl)$_2$, —O—$C_{1-20}$-alkyl, and N—O—C(O)—$C_{1-20}$-alkyl, and phenyl may be substituted with 1 or 2 $C_{1-16}$-alkyl groups.

More preferably, $R^1$ and $R^2$ are independently from each other $C_{6-30}$-alkyl, $C_{6-30}$-alkenyl or $C_{6-30}$-alkynyl,
wherein each of the $C_{6-30}$-alkyl, $C_{6-30}$-alkenyl or $C_{6-30}$-alkynyl group may be substituted with 1 to 10 substituents independently selected from the group consisting of halogen, —CN, —NO$_2$, —NH($C_{1-20}$-alkyl), —N($C_{1-20}$-alkyl)$_2$, —NH—C(O)—($C_{1-20}$-alkyl), —C(O)—$C_{1-20}$-alkyl, —C(O)—O$C_{1-20}$-alkyl, —C(O)NH$_2$, —CO(O)NH—$C_{1-20}$-alkyl, —C(O)N($C_{1-20}$-alkyl)$_2$, —O—$C_{1-20}$-alkyl, and N—O—C(O)—$C_{1-20}$-alkyl.

Even more preferably, $R^1$ and $R^2$ are independently from each other $C_{6-30}$-alkyl,
wherein each of the $C_{6-30}$-alkyl may be substituted with 1 to 10 substituents independently selected from the group consisting of halogen, —CN, —NO$_2$, —NH($C_{1-20}$-alkyl), —N($C_{1-20}$-alkyl)$_2$, —NH—C(O)—($C_{1-20}$-alkyl), —C(O)—$C_{1-20}$-alkyl, —C(O)—O$C_{1-20}$-alkyl, —C(O)NH$_2$, —CO(O)NH—$C_{1-20}$-alkyl, —C(O)N($C_{1-20}$-alkyl)$_2$, —O—$C_{1-20}$-alkyl, and N—O—C(O)—$C_{1-20}$-alkyl.

Most preferably, $R^1$ and $R^2$ are independently from each other $C_{10-30}$-alkyl, in particular 2-octyldodecyl.

Preferably, o is 1 or 2.

n is preferably an integer from 5 to 1'000, more preferably an integer from 5 to 500, most preferably an integer from 10 to 100.

Preferred polymers comprising a unit of formula (1) are polymers,
wherein
$R^1$ and $R^2$ are independently from each other $C_{6-30}$-alkyl, $C_{6-30}$-alkenyl, $C_{6-30}$-alkynyl, or phenyl, wherein each of the $C_{6-30}$-alkyl, $C_{6-30}$-alkenyl or $C_{6-30}$-alkynyl group may be substituted with 1 to 10 substituents independently selected from the group consisting of halogen, —CN, —NO$_2$, —OH, —NH$_2$, —NH($C_{1-20}$-alkyl), —N($C_{1-20}$-alkyl)$_2$, —NH—C(O)—($C_{1-20}$-alkyl), —S(O)$_2$OH, —CHO, —C(O)—$C_{1-20}$-alkyl, —C(O)OH, —C(O)—O$C_{1-20}$-alkyl, —C(O)NH$_2$, —CO(O)NH—$C_{1-20}$-alkyl, —C(O)N($C_{1-20}$-alkyl)$_2$, —O—$C_{1-20}$-alkyl, and N—O—C(O)—$C_{1-20}$-alkyl, and phenyl may be substituted with 1 or 2 $C_{1-16}$-alkyl groups.

o is 1, 2 or 3 and n is an integer from 5 to 1'000.

More preferred polymers comprising a unit of formula (1) are polymers, wherein $R^1$ and $R^2$ are independently from each other $C_{6-30}$-alkyl, $C_{6-30}$-alkenyl or $C_{6-30}$-alkynyl, wherein each of the $C_{6-30}$-alkyl, $C_{6-30}$-alkenyl or $C_{6-30}$-alkynyl group may be substituted with 1 to 10 substituents independently selected from the group consisting of halogen, —CN, —NO$_2$, —NH($C_{1-20}$-alkyl), —N($C_{1-20}$-alkyl)$_2$, —NH—C(O)—($C_{1-20}$-alkyl), —C(O)—$C_{1-20}$-alkyl, —C(O)—O$C_{1-20}$-alkyl, —C(O)NH$_2$, —CO(O)NH—$C_{1-20}$-alkyl, —C(O)N($C_{1-20}$-alkyl)$_2$, —O—$C_{1-20}$-alkyl, and N—O—C(O)—$C_{1-20}$-alkyl, o is 1, 2 or 3 and n is an integer from 5 to 500.

Most preferred polymers comprising a unit of formula (1) are polymers, wherein $R^1$ and $R^2$ are independently from each other $C_{6-30}$-alkyl, wherein each of the $C_{6-30}$-alkyl may be substituted with 1 to 10 substituents independently selected from the group consisting of halogen, —CN, —NO$_2$, —NH($C_{1-20}$-alkyl), —N($C_{1-20}$-alkyl)$_2$, —NH—C(O)—($C_{1-20}$-alkyl), —C(O)—$C_{1-20}$-alkyl, —C(O)—O$C_{1-20}$-alkyl, —C(O)NH$_2$, —CO(O)NH—$C_{1-20}$-alkyl, —C(O)N($C_{1-20}$-alkyl)$_2$, —O—$C_{1-20}$-alkyl, and N—O—C(O)—$C_{1-20}$-alkyl, o is 1 or 2 and n is an integer from 10 to 100.

Particular preferred polymers comprising a unit of formula (1) are polymers comprising a unit of

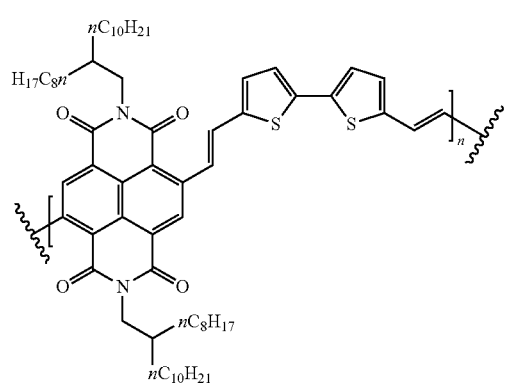

(1a)

or

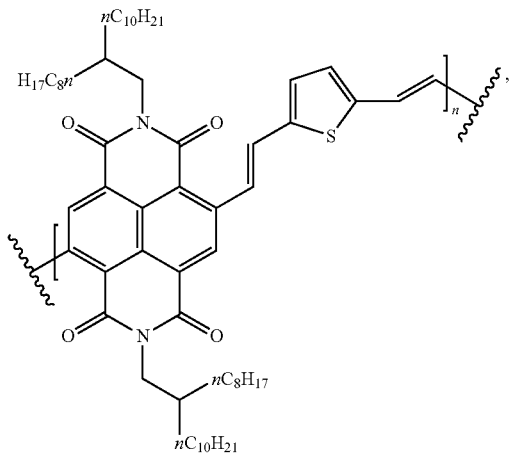

(1b)

wherein n is an integer from 20 to 100, preferably around 60.

Also part of the invention is a process for the preparation of the polymers comprising a unit of formula

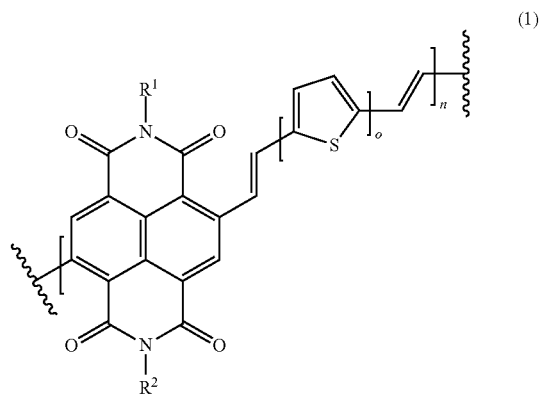

(1)

wherein $R^1$ and $R^2$ are independently from each other $C_{1-30}$-alkyl, $C_{2-30}$-alkenyl or $C_{2-30}$-alkynyl, phenyl or a 5 to 8 membered heterocyclic ring system, wherein each of the $C_{1-30}$-alkyl, $C_{2-30}$-alkenyl or $C_{2-30}$-alkynyl group may be substituted with 1 to 10 substituents independently selected from the group consisting of halogen, —CN, —NO$_2$, —OH, —NH$_2$, —NH($C_{1-20}$-alkyl), —N($C_{1-20}$-alkyl)$_2$, —NH—C(O)—($C_{1-20}$-alkyl), —S(O)$_2$OH, —CHO, —C(O)—$C_{1-20}$-alkyl, —C(O)OH, —C(O)—O$C_{1-20}$-alkyl, —C(O)NH$_2$, —CO(O)NH—$C_1$20 alkyl, —C(O)N($C_{1-20}$-alkyl)$_2$, —O—$C_{1-20}$-alkyl, —O—C(O)—$C_{1-20}$-alkyl, —SiH$_3$, SiH$_2$($C_{1-20}$-alkyl), SiH($C_{1-20}$-alkyl)$_2$, Si($C_{1-20}$-alkyl)$_3$, $C_{4-8}$-cycloalkyl, phenyl and a 5 to 8 membered heterocyclic ring system, and phenyl or a 5 to 8 membered heterocyclic ring system may be substituted with 1 to 5 $C_{1-16}$-alkyl groups, and o is 1, 2 or 3 and n is an integer from 2 to 10'000, which process comprises the step of reacting a compound of formula

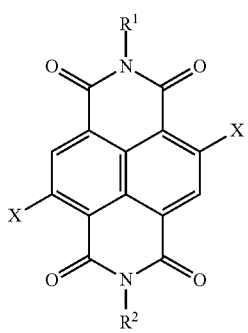

wherein

R¹ and R² are independently from each other $C_{1-30}$-alkyl, $C_{2-30}$-alkenyl, $C_{2-30}$-alkynyl, phenyl or a 5 to 8 membered heterocyclic ring system, wherein each of the $C_{1-30}$-alkyl, $C_{2-30}$-alkenyl or $C_{2-30}$-alkynyl group may be substituted with 1 to 10 substituents independently selected from the group consisting of halogen, —CN, —NO$_2$, —OH, —NH$_2$, —NH($C_{1-20}$-alkyl), —N($C_{1-20}$-alkyl)$_2$, —NH—C(O)—($C_{1-20}$-alkyl), —S(O)$_2$OH, —CHO, —C(O)—$C_{1-20}$-alkyl, —C(O)OH, —C(O)—O$C_{1-20}$-alkyl, —C(O)NH$_2$, —CO(O)NH—$C_{1-20}$-alkyl, —C(O)N($C_{1-20}$-alkyl)$_2$, —O—$C_{1-20}$-alkyl, —O—C(O)—$C_{1-20}$-alkyl, —SiH$_3$, SiH$_2$($C_{1-20}$-alkyl), SiH($C_{1-20}$-alkyl)$_2$, Si($C_{1-20}$-alkyl)$_3$, $C_{4-8}$-cycloalkyl, phenyl and a 5 to 8 membered heterocyclic ring system, and phenyl or a 5 to 8 membered heterocyclic ring system may be substituted with 1 to 5 $C_{1-16}$-alkyl groups, and X is triflate or halogen, preferably Br—, with a compound of formula

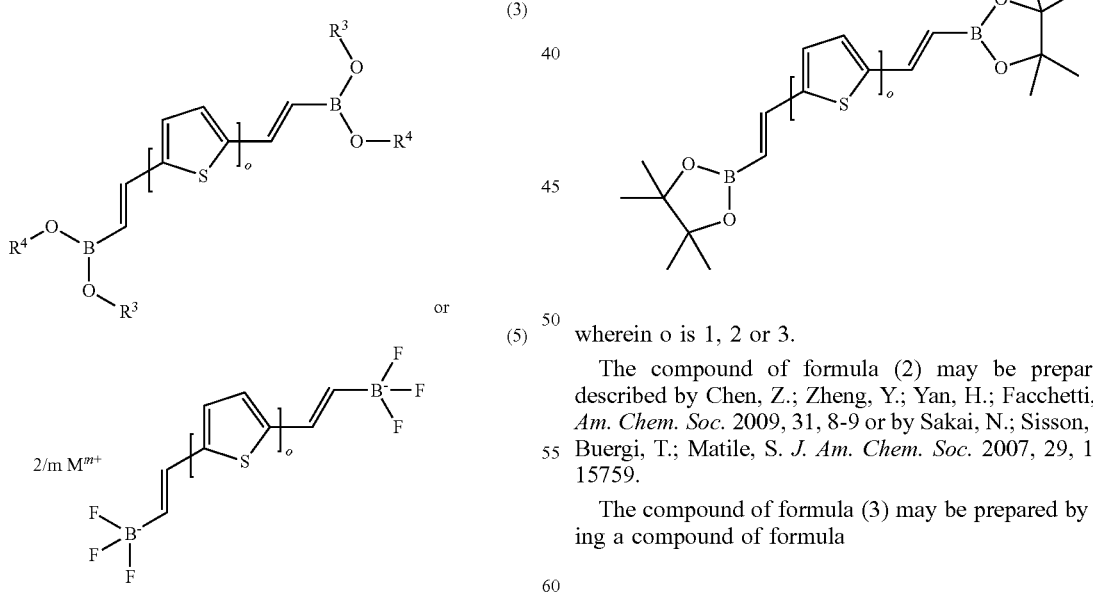

wherein

R³ and R⁴ are independently from each other H or $C_{1-10}$-alkyl, or R³ and R⁴ together with the —O—B—O— unit linking them form a cycle, preferably a five-membered cycle, which may be substituted with one or two $C_{1-6}$-alkyl, preferably methyl, M is an alkali metal, an alkaline earth metal or Al, m is 1, 2 or 3, o is 1, 2 or 3.

The compound of formula (2) is preferably reacted with the compound of formula (3) or (5) in the presence of transition metal catalyst I, preferably a palladium catalyst, and a base.

Examples of palladium catalysts are tetrakis(triphenyl)phosphinepalladium(0), palladium(II) chloride and palladium(II) acetate. Preferably, the palladium catalyst is palladium(II) acetate.

The base can be an amine, a metal or alkaline earth metal carbonate, a metal or alkaline earth metal acetate or an alkali or alkaline earth metal hydroxide. Examples of alkali or alkaline earth metal hydroxides are sodium, potassium and lithium hydroxide. Preferably, the base is an alkali or alkaline earth metal hydroxide. More preferably, the base is lithium hydroxide.

Preferably, a phosphine is also present in addition to the metal catalyst and the base. Examples of phosphines are triphenylphosphine, and, preferably, N-phenylpyrrole-P(tert-butyl)$_2$.

The reaction can be performed in the presence of an organic solvent such as tetrahydrofurane.

The reaction can be performed at elevated temperature, preferably in the range of 50 to 200° C., more preferably in the range of 50 to 120° C., most preferably in the range of 60 to 90° C.

Preferably, compound (2) is reacted with compound (3).

A preferred compound of formula (3) is the compound of formula (3')

wherein o is 1, 2 or 3.

The compound of formula (2) may be prepared as described by Chen, Z.; Zheng, Y.; Yan, H.; Facchetti, A. *J. Am. Chem. Soc.* 2009, 31, 8-9 or by Sakai, N.; Sisson, A. L.; Buergi, T.; Matile, S. *J. Am. Chem. Soc.* 2007, 29, 15758-15759.

The compound of formula (3) may be prepared by reacting a compound of formula

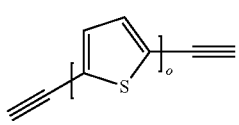

wherein o is 1, 2 or 3 with $(R^3O)$—B—$(OR^4)$ (6), wherein
$R^3$ and $R^4$ are independently from each other H or $C_{1-10}$-alkyl, or $R^3$ and $R^4$ together with the —O—B—O— unit linking them form a cycle, preferably a five-membered cycle, which may be substituted with one or two $C_{1-6}$-alkyl, preferably methyl.

The compound of formula (3) is preferably reacted with the compound of formula (6) in the presence of transition metal catalyst II, preferably a zirconium catalyst, more preferably $ZrCp_2HCl$, also called Schwartz's reagent.

A preferred compound of formula (6) is

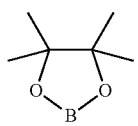

(6a)

The reaction can be performed at elevated temperature, preferably in the range of 40 to 200° C., more preferably in the range of 40 to 100° C., most preferably in the range of 50 to 80° C.

The compound of formula (4) can be prepared by methods known in the art.

For example the preparation of the compound of formula

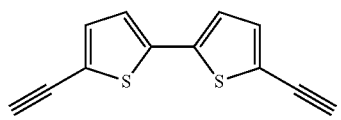

(4a)

is described in Huang, E. Chem. Commun. 2011, 47, 11990-11992.

For example, the preparation of the compound of formula

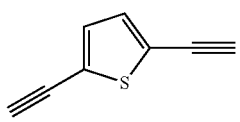

(4b)

is described by Neenan, Thomas X.; Whitesides, George M. J. Org. Chem., 1988, 53, 2489-2496.

Also part of the invention is an electronic device comprising the polymer comprising a unit of formula (1) as semiconducting material.

The electronic device can be any electronic device, for example an organic photovoltaic (OPV) cell, an organic field-effect transistor (OFET) or an organic light emitting diode (OLED). Preferably, the electronic device is an organic field-effect transistor.

Usually, an organic field effect transistor comprises a dielectric layer, a semiconducting layer and a substrate. In addition, an organic field effect transistor usually comprises a gate electrode and source/drain electrodes.

An organic field effect transistor can have various designs, for example bottom-gate design or top-gate design.

The semiconducting layer comprises the polymer of the present invention. The semiconducting layer can have a thickness of 5 to 500 nm, preferably of 10 to 100 nm, more preferably of 20 to 50 nm.

The dielectric layer comprises a dielectric material. The dielectric material can be silicon dioxide, or, an organic polymer such as polystyrene (PS), poly(methylmethacrylate) (PMMA), poly(4-vinylphenol) (PVP), poly(vinyl alcohol) (PVA), benzocyclobutene (BCB), or polyimide (PI). The dielectric layer can have a thickness of 10 to 2000 nm, preferably of 50 to 1000 nm, more preferably of 100 to 800 nm.

The source/drain electrodes can be made from any suitable source/drain material, for example silver (Ag), gold (Au) or tantalum (Ta). The source/drain electrodes can have a thickness of 1 to 100 nm, preferably from 5 to 50 nm.

The gate electrode can be made from any suitable gate material such as highly doped silicon, aluminium (Al), tungsten (W), indium tin oxide, gold (Au) and/or tantalum (Ta). The gate electrode can have a thickness of 1 to 200 nm, preferably from 5 to 100 nm.

The substrate can be any suitable substrate such as glass, or a plastic substrate such as polyethersulfone, polycarbonate, polysulfone, polyethylene terephthalate (PET) and polyethylene naphthalate (PEN). Depending on the design of the organic field effect transistor, a combination of the gate electrode and the dielectric layer can also function as substrate.

The organic field effect transistor can be prepared by methods known in the art.

For example, a top-gate organic field effect transistor can be prepared as follows:

The source and drain electrodes can be formed by lithographically patterning a suitable source/drain material, for example Ag on a suitable substrate, example PET. The source/drain electrodes can then be covered with the semiconducting layer by solution processing, for example spin-coating, a solution of the semiconducting material of the present invention in a suitable solvent, for example in tetralin or toluene. The semiconducting layer can be covered with a dielectric layer by spin-coating a dielectric material, for example polystyrene, on the semiconducting layer. The gate electrode can be deposited on the dielectric layer for example by vapour deposition of a suitable source/drain material, for example gold (Au).

Also part of the invention is the use of the polymer comprising a unit of formula (1) as semiconducting material.

The polymers of the present invention show a high stability, in particular towards oxidation, under ambient conditions. The polymers of the present invention are compatible with liquid processing techniques and thus allow the production of low cost, light weight and flexible electronic devices. Organic devices, in particular organic field effect transistors, comprising the polymers of the present invention as semiconducting material show high charge carrier mobilities and on/off ratios.

EXAMPLES

Example 1

Preparation of Polymer 1a

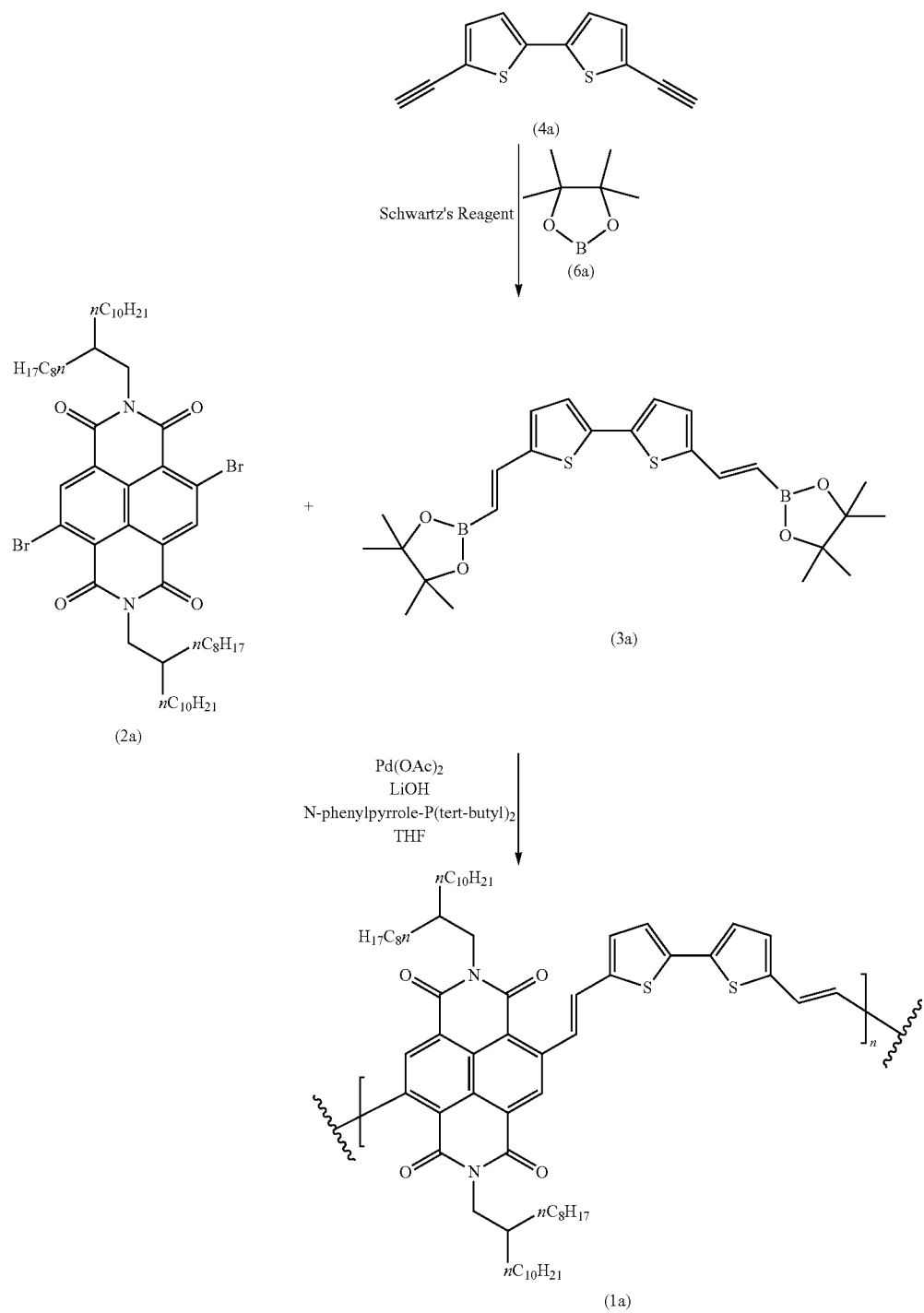

Preparation of Compound 3a

A mixture of 5,5'-diethynyl-2,2'-bithiophene (4a) (2.2 g, 10 mmol), pinacolborane (6a) (2.7 g, 21 mmol) and ZrCp$_2$HCl (Schwartz's reagent) (260 mg, 1 mmol) is sealed in a tube and stirred at 65° C. for 48 hours. Afterwards, the mixture is passed through silica gel pad and further purified on reverse phase column using hexane and ethyl acetate as eluent (hexane:ethyl acetate=10:1) to yield compound 3a as a white solid (2.1 g, 49%). $^1$H NMR (400 MHz, CDCl$_3$) δ 7.39 (d, 2H, J=18 Hz), 7.07 (d, 2H, J=3.6 Hz), 7.97 (d, 2H, J=3.6 Hz), 5.97 (d, 2H, J=18 Hz), 1.50 (s, 24H).

Preparation of Polymer 1a

Compound 2a (300 mg, 0.31 mmol), compound 3a (180 mg, 0.38 mmol), N-phenylpyrrole-P(tert-butyl)$_2$ (18 mg, 0.06 mmol), Pd(OAc)$_2$ (3 mg, 0.02 mmol) and LiOH (96 mg, 2.29 mmol) are added to a Schlenk tube. The reaction vessel is evacuated and refilled with N$_2$ 3 times. Anhydrous THF (13 mL) is then added and heated under N$_2$ at 70° C. After 20 minutes, 1 drop of 2-bromothiophene is added and allowed to stir for 1 h. 1 drop of 2-thiophene boronic acid is added and the reaction mixture is allowed to stir at 70° C. for another 1 hour. The reaction mixture is precipitated in a large beaker of stirring MeOH (900 mL) for 1 hour before being filtered and the residue is subjected to Soxhlet extraction with acetone (250 mL) overnight until the extract is colorless. The residue is dried under vacuum, dissolved in minimum amount of hot chlorobenzene and precipitated in a beaker of stirring MeOH (900 mL) for 1 hour before being filtered and the residue is dried under vacuum overnight to yield polymer 1a (310 mg, 97%). $^1$H NMR (400 MHz, DCE, r.t.) δ 9.06 (brs, 2H), 8.74 (d, 2H, 15.6 Hz), 7.64 (d, 2H, 15.6 Hz), 7.27-7.03 (m, 4H), 4.25 (br, 4H), 2.40 (br, 2H), 1.49-1.17 (m, 64H), 1.01-0.90 (brs, 12H). Mn: 3.44×10$^4$, PDI: 2.06.

Example 2

Preparation of Polymer 1b

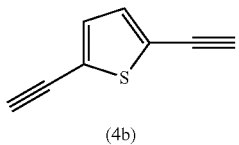

(4b)

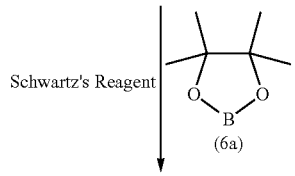

(6a)

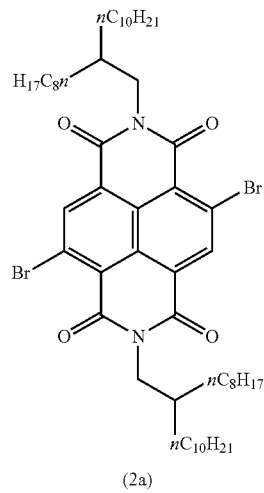

(2a)

+

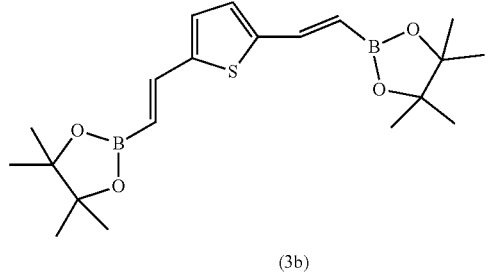

(3b)

Pd(OAc)$_2$
LiOH
N-phenylpyrrole-P(tert-butyl)$_2$
THF

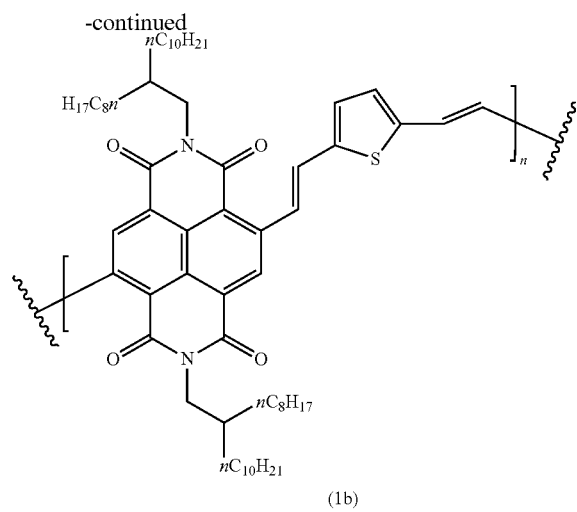

(1b)

Preparation of Compound 3b

A mixture of 2,5-diethynylthiophene (4b) (1.4 g, 10 mmol), pinacolborane (6a) (2.8 g, 21 mmol) and ZrCp$_2$HCl (Schwartz's reagent) (260 mg, 1 mmol) is sealed in a tube and stirred at 65° C. for 70 hours. Afterwards, the mixture is passed through silica gel pad and further purified on reverse phase column using hexane and ethyl acetate as eluent (hexane:ethyl acetate=15:1) to yield compound 3b as a white solid (1.55 g, 40%). $^1$H NMR (400 MHz, CDCl$_3$) δ 7.38 (d, 2H, J=18 Hz), 6.95 (s, 2H), 5.91 (d, 2H, J=18 Hz), 1.50 (s, 24H).

Preparation of Polymer 1b

Compound 2a (450 mg, 0.46 mmol), compound 3b (177 mg, 0.46 mmol), N-phenylpyrrole-P(tert-butyl)$_2$ (21 mg, 0.07 mmol), Pd(OAc)$_2$ (4 mg, 0.02 mmol) and LiOH (115 mg, 2.74 mmol) are added to a Schlenk tube. The reaction vessel is evacuated and refilled with N$_2$ 3 times. Anhydrous THF (11 mL) is then added and heated under N$_2$ at 70° C. After 22 hours, 1 drop of 2-bromothiophene is added and allowed to stir for 1 hour. 1 drop of 2-thiophene boronic acid is added and the reaction mixture is allowed to stir at 70° C. for another 4 hours. The reaction mixture is precipitate in a large beaker of stirring MeOH (900 mL) for 1 hour before being filtered and the residue is subjected to Soxhlet extraction with acetone (250 mL) overnight until the extract is colorless. The residue is dried under vacuum, dissolved in minimum amount of hot chlorobenzene and precipitated in a beaker of stirring MeOH (900 mL) for 1 hour before being filtered and the residue is dried under vacuum overnight to yield polymer 1b. (330 mg, 73%). $^1$H NMR (400 MHz, DCE, r.t) δ 9.06 (brs, 2H), 8.70 (d, 2H, 15.6 Hz), 7.58 (d, 2H, 15.6 Hz), 7.52-7.40 (m, 2H), 4.29 (br, 4H), 2.14 (br, 2H), 1.50-1.34 (m, 64H), 1.01-0.90 (brs, 12H). Mn: 2.85×10$^4$, PDI: 2.25.

Example 3

Preparation of a Top-Gate Bottom-Contact Field-Effect Transistors Comprising the Polymer 1a, Respectively, 1b as Semiconducting Material The polymer 1a is dissolved in toluene (5 mg/ml) and spin coated on a PET substrate with litographically patterned silver (Ag) contact (W/L=1000, L=10 μm) at 1500 rpm for 1 minute followed by drying on a 110° C. hotplate for 2 minute.

The polymer 1b is dissolved in tetralin (5 mg/ml) and spin coated (heated solution and substrate at 110° C.) on a PET substrate with litographically patterned silver (Ag) contact (W/L=1000, L=10 μm) at 1000 rpm for 2 minute followed by drying on a 110° C. hotplate for 2 minute.

In both cases, polystyrene is used as gate dielectric (4 wt % in isopropyl actetate) and is deposited by spin coating at 3600 rpm for 30 sec followed by drying on a 90° C. hotplate for 30 sec. All the depositions are done in ambient atmosphere. Finally gold (Au) is deposited by thermal evaporation for use as gate electrode. The thickness of the semiconducting layer is 30 nm, and the thickness of the dielectric layer is 420 nm.

Average charge carrier mobility of the transistor comprising the polymer 1a is 0.03 cm$^2$Ns with on/off ratio of 10$^5$, while the charge carrier mobility of the transistor comprising the polymer of formula 1b is 0.04 cm$^2$Ns with on/off ~10$^4$.

The invention claimed is:

1. A polymer comprising a unit of formula

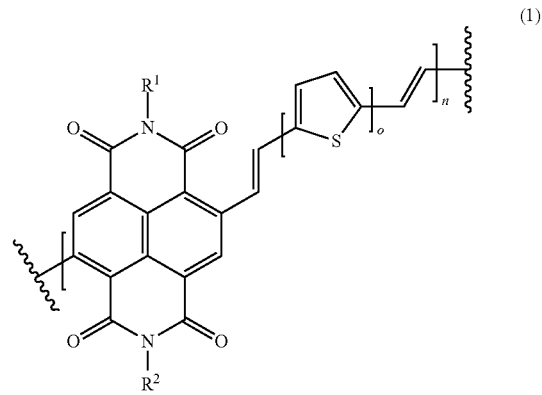

(1)

wherein

R$^1$ and R$^2$ are independently from each other C$_{1-30}$-alkyl, C$_{2-30}$-alkenyl, C$_{2-30}$-alkynyl, phenyl or a 5 to 8 membered heterocyclic ring system, wherein each of the $C_{1-30}$-alkyl, $C_{2-30}$-alkenyl or $C_{2-30}$-alkynyl group may be substituted with 1 to 10 substituents independently selected from the group consisting of halogen, —CN, —NO$_2$, —OH, —NH$_2$, —NH($C_{1-20}$-alkyl), —N($C_{1-20}$-alkyl)$_2$, —NH—C(O)—($C_{1-20}$-alkyl), —S(O)$_2$OH, —CHO, —C(O)—$C_{1-20}$-alkyl, —C(O)OH, —C(O)—O$C_{1-20}$-alkyl, —C(O)NH$_2$, —CO(O)NH—$C_{1-20}$-alkyl, —C(O)N($C_{1-20}$-alkyl)$_2$, —O—$C_{1-20}$-alkyl, —O—C(O)—$C_{1-20}$-alkyl, —SiH$_3$, SiH$_2$($C_{1-20}$-alkyl), SiH($C_{1-20}$-alkyl)$_2$, Si($C_{1-20}$-alkyl)$_3$, $C_{4-8}$-cycloalkyl, phenyl and a 5 to 8 membered heterocyclic ring system, and phenyl or a 5 to 8 membered heterocyclic ring system may be substituted with 1 to 5 $C_{1-16}$-alkyl groups, o is 2 or 3 and n is an integer from 2 to 10,000.

2. The polymer of claim 1, wherein $R^1$ and $R^2$ are independently from each other $C_{6-30}$-alkyl, $C_{6-30}$-alkenyl, $C_{6-30}$-alkynyl, or phenyl, wherein each of the $C_{6-30}$-alkyl, $C_{6-30}$-alkenyl or $C_{6-30}$-alkynyl groups may be substituted with 1 to 10 substituents independently selected from the group consisting of halogen, —CN, —NO$_2$, —OH, —NH$_2$, —NH($C_{1-20}$-alkyl), —N($C_{1-20}$-alkyl)$_2$, —NH—C(O)—($C_{1-20}$-alkyl), —S(O)$_2$OH, —CHO, —C(O)—$C_{1-20}$-alkyl, —C(O)OH, —C(O)—O$C_{1-20}$-alkyl, —C(O)NH$_2$, —CO(O)NH—$C_{1-20}$-alkyl, —C(O)N($C_{1-20}$-alkyl)$_2$, —O—$C_{1-20}$-alkyl, and N—O—C(O)—$C_{1-20}$-alkyl, and phenyl may be substituted with 1 or 2 $C_{1-16}$-alkyl groups.

3. The polymer of claim 1, wherein $R^1$ and $R^2$ are independently from each other $C_{6-30}$-alkyl, $C_{6-30}$-alkenyl or $C_{6-30}$-alkynyl, wherein each of the $C_{6-30}$-alkyl, $C_{6-30}$-alkenyl or $C_{6-30}$-alkynyl group may be substituted with 1 to 10 substituents independently selected from the group consisting of halogen, —CN, —NO$_2$, —NH($C_{1-20}$-alkyl), —N($C_{1-20}$-alkyl)$_2$, —NH—C(O)—($C_{1-20}$-alkyl), —C(O)—$C_{1-20}$-alkyl, —C(O)—O$C_{1-20}$-alkyl, —C(O)NH$_2$, —CO(O)NH—$C_{1-20}$-alkyl, —C(O)N($C_{1-20}$-alkyl)$_2$, —O—$C_{1-20}$-alkyl, and N—O—C(O)—$C_{1-20}$-alkyl.

4. The polymer of claim 1, wherein $R^1$ and $R^2$ are independently from each other $C_{6-30}$-alkyl, wherein each of the $C_{6-30}$-alkyl may be substituted with 1 to 10 substituents independently selected from the group consisting of halogen, —CN, —NO$_2$, —NH($C_{1-20}$-alkyl), —N($C_{1-20}$-alkyl)$_2$, —NH—C(O)—($C_{1-20}$-alkyl), —C(O)—$C_{1-20}$-alkyl, —C(O)—O$C_{1-20}$-alkyl, —C(O)NH$_2$, —CO(O)NH—$C_{1-20}$-alkyl, —C(O)N($C_{1-20}$-alkyl)$_2$, —O—$C_{1-20}$-alkyl, and N—O—C(O)—$C_{1-20}$-alkyl.

5. The polymer of claim 1, wherein $R^1$ and $R^2$ are independently from each other $C_{10-30}$-alkyl.

6. The polymer of claim 5, wherein $R^1$ and/or $R^2$ are independently from each other 2-octyldodecyl.

7. The polymer of claim 1, wherein o is 2.

8. The polymer of claim 1, wherein n is an integer from 5 to 1,000.

9. The polymer of claim 1, wherein n is an integer from 5 to 500.

10. The polymer of claim 1, wherein n is an integer from 10 to 100.

11. The polymer of claim 1 comprising a unit of formula

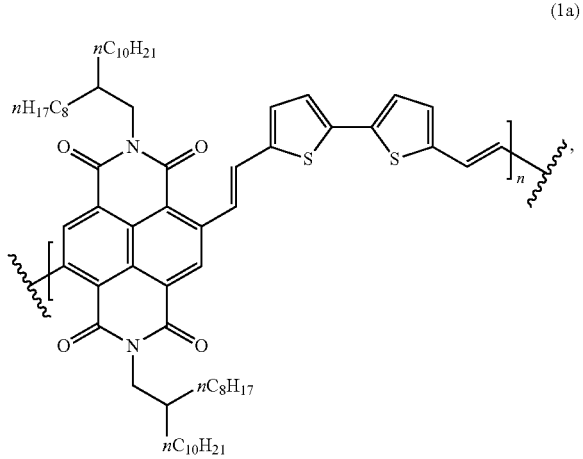

(1a)

wherein n is an integer from 20 to 100.

12. An electronic device comprising the polymer of claim 1 as semiconducting material.

13. The electronic device of claim 12, wherein the electronic device is an organic field effect transistor.

14. The electronic device of claim 12, wherein the electronic device is an organic photovoltaic device.

15. A semiconducting material comprising the polymer of claim 1.

16. A process for the preparation of the polymer of claim 1, comprising reacting a compound of formula

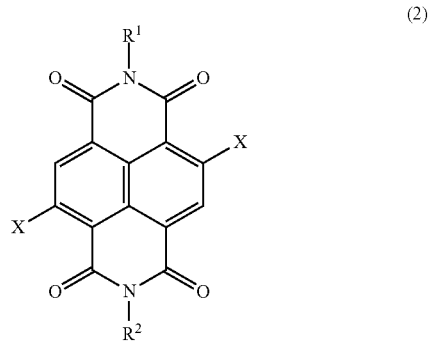

(2)

wherein $R^1$ and $R^2$ are independently from each other $C_{1-30}$-alkyl, $C_{2-30}$-alkenyl, $C_{2-30}$-alkynyl, phenyl or a 5 to 8 membered heterocyclic ring system, wherein each of the $C_{1-30}$-alkyl, $C_{2-30}$-alkenyl or $C_{2-30}$-alkynyl group may be substituted with 1 to 10 substituents independently selected from the group consisting of halogen, —CN, —NO$_2$, —OH, —NH$_2$, —NH($C_{1-20}$-alkyl), —N($C_{1-20}$-alkyl)$_2$, —NH—C(O)—($C_{1-20}$-alkyl), —S(O)$_2$OH, —CHO, —C(O)—$C_{1-20}$-alkyl, —C(O)OH, —C(O)—O$C_{1-20}$-alkyl, —C(O)NH$_2$, —CO(O)NH—$C_{1-20}$-alkyl, —C(O)N($C_{1-20}$-alkyl)$_2$, —O—$C_{1-20}$-alkyl, —O—C(O)—$C_{1-20}$-alkyl, —SiH$_3$, SiH$_2$($C_{1-20}$-alkyl), SiH($C_{1-20}$-alkyl)$_2$, Si($C_{1-20}$-alkyl)$_3$, $C_{4-8}$-cycloalkyl, phenyl and a 5 to 8 membered heterocyclic ring system, and phenyl and the 5 to 8 membered heterocyclic ring system may be substituted with 1 to 5 $C_{1-16}$-alkyl groups, and X is triflate or halogen, with a compound of formula

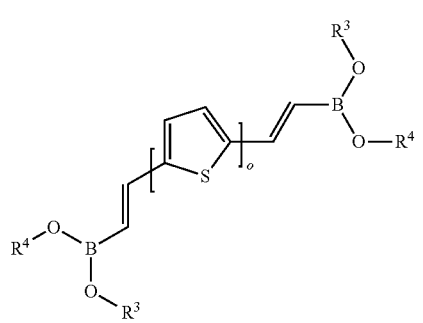

(3)

or

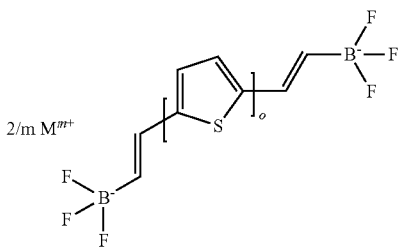

(5)

wherein
$R^3$ and $R^4$ are independently from each other H or $C_{1-10}$-alkyl, or $R^3$ and $R^4$ together with the —O—B—O— unit linking them form a cycle which may be substituted with one or two C1-6-alkyl, M is an alkali metal, an alkaline earth metal or Al, m is 1, 2 or 3, o is 2 or 3.

17. The process of claim 16, wherein X is Br.

18. The process of claim 16, wherein $R^3$ and $R^4$ together with the —O—B—O— unit linking them form a five-membered cycle.

19. The process of claim 16, wherein $R^3$ and $R^4$ together with the —O—B—O— unit linking them form a five-membered cycle, which is substituted with one or two C1-6-alkyl.

20. The process of claim 19, wherein the five-membered cycle is substituted with one or two methyl.

* * * * *